United States Patent
Moriyama et al.

(10) Patent No.: US 8,350,284 B2
(45) Date of Patent: Jan. 8, 2013

(54) LIGHT EMITTING ELEMENT AND LIGHT EMITTING DEVICE

(75) Inventors: Miki Moriyama, Aichi-ken (JP); Koichi Goshonoo, Aichi-ken (JP)

(73) Assignee: Toyoda Gosei Co., Ltd., Nishikasugai-Gun, Aichi-Ken (JP)

( * ) Notice: Subject to any disclaimer, the term of this patent is extended or adjusted under 35 U.S.C. 154(b) by 219 days.

(21) Appl. No.: 12/585,937

(22) Filed: Sep. 29, 2009

(65) Prior Publication Data

US 2010/0078649 A1 Apr. 1, 2010

(30) Foreign Application Priority Data

Sep. 30, 2008 (JP) ................. P2008-254288

(51) Int. Cl.
 *H01L 33/00* (2010.01)
(52) U.S. Cl. ............ 257/99; 257/E33.066; 257/E33.025
(58) Field of Classification Search .......... 313/498–499, 313/501, 504; 257/99, E33.066, E33.025
See application file for complete search history.

(56) References Cited

U.S. PATENT DOCUMENTS

| | | | |
|---|---|---|---|
| 6,940,099 B2 | 9/2005 | Hata et al. | |
| 2005/0062060 A1 | 3/2005 | Nagai et al. | |
| 2006/0118775 A1* | 6/2006 | Nagai et al. | 257/13 |
| 2006/0158103 A1* | 7/2006 | Katano et al. | 313/504 |
| 2007/0145883 A1* | 6/2007 | Ohashi et al. | 313/498 |
| 2008/0006838 A1 | 1/2008 | Hattori et al. | |
| 2008/0210959 A1 | 9/2008 | Nagai et al. | |

FOREIGN PATENT DOCUMENTS

| | | |
|---|---|---|
| JP | 7-022648 A | 1/1995 |
| JP | 2003-86843 | 3/2003 |
| JP | 2005-19608 | 1/2005 |
| JP | 2005-223362 A | 8/2005 |
| JP | 2008-016556 A | 1/2008 |
| JP | 2008-098249 A | 4/2008 |
| JP | 2008-130721 A | 6/2008 |
| JP | 2008-171997 A | 7/2008 |

OTHER PUBLICATIONS

Notification of Reasons for Refusal, dated Apr. 27, 2012, with English-language translation.

* cited by examiner

*Primary Examiner* — Colleen Matthews
(74) *Attorney, Agent, or Firm* — McGinn IP Law Group PLLC (57) ABSTRACT

A light emitting element which emits light of a wavelength, includes a substrate which is transparent to the wavelength of emitted light and includes a first surface and a second surface; a semiconductor layer stacked on the first surface; a first electrode which is reflective to the wavelength of emitted light and formed on a surface of the semiconductor layer, wherein electrical resistance of the first electrode in a farthest distance is equal to or smaller than 1Ω; and a second electrode which is reflective to the wavelength of emitted light and formed on the second surface, wherein electrical resistance of the second electrode in a farthest distance is equal to or smaller than 1Ω.

24 Claims, 7 Drawing Sheets

LIGHT EMITTING ELEMENT AND LIGHT EMITTING DEVICE

CROSS-REFERENCE TO RELATED APPLICATIONS

This patent application claims foreign priority from Japanese Patent Application JP-2008-254288 filed on Sep. 30, 2008 and subject matters of which are incorporated herein by reference.

TECHNICAL FIELD

The present invention relates to a light emitting element, which is particularly suitable for large current uses.

BRIEF DESCRIPTION OF RELATED ART

In recent years, with the improved luminous efficiency of an LED, it is expected that the LED is applied to a light source for general illuminations. In the general illumination uses, since not only the high luminous efficiency but also the luminosity are sought, it is required that the light output per device is increased as much as possible, whereby the driving at large currents of 1 A or more is needed.

A fundamental method for increasing the drive current involves increasing the size of an element. A problem that arises in driving the large LED at large currents of 1 A or more is a rise in the drive voltage, which is required to greatly decrease. A cause of the rise in the drive voltage is that the current diffusion distance in the plane direction of element becomes larger to increase a voltage drop owing to the current diffusion. A power owing to this voltage drop is consumed as heat to remarkably degrade the performance of the element. Also, fluctuation in the luminous strength within the element plane is a problem. This is because there is un-uniformity of the in-plane current density injected into an active layer, producing an area of remarkably high current density and causing the reliability of the element to be degraded. To solve these problems, a method for efficiently diffusing the current in the direction of the substrate plane by forming the electrodes like wirings is taken under present circumstances.

Also, if the size of the element is increased, the light extraction efficiency is worse, and required to improve. For example, it is possible to improve the light extraction efficiency from the lateral surface by working the back surface of a GaN substrate to provide a tapered concave portion, as described in JP-A-2005-19608.

On the other hand, a light emitting element having a structure in which a semiconductor layer is stacked on the GaN substrate, an n electrode is formed on the back surface of the GaN substrate, and a p electrode is formed on the surface of the semiconductor layer, the n electrode and the p electrode being made of a highly reflective metal, to extract the light from the lateral surface is described in JP-A-2003-86843.

SUMMARY

However, if the electrodes are formed like wirings, there is a problem that an increase in the drive voltage caused by the wiring resistance could not be ignored while the large current flows. Also, because of a higher current density per the wiring section, a deformation due to electro migration may occur, resulting in a problem with the reliability of the element.

Also, in the light emitting element as described in JP-A-2003-86843, since the area of the p electrode and the n electrode can be wider, the current can be diffused in the direction parallel to the substrate surface to some extent, but since the resistance of the p electrode and the n electrode is not low enough, there is a great bias in the distribution of current density in the direction of the substrate plane, possibly resulting in a problem in terms of the luminous efficiency or reliability. Also, there is a problem that if the areas of the p electrode and the n electrode are wide, the light extraction efficiency is degraded.

Thus, it is an object of the invention to realize a light emitting element in which the drive voltage is suppressed and the reliability is improved.

A light emitting element according to a first aspect of the present invention is a light emitting element which emits light of a wavelength, includes a substrate which is transparent with respect to the wavelength and includes a first surface and a second surface; a semiconductor layer stacked on the first surface; a first electrode which is reflective with respect to the wavelength and formed on a surface of the semiconductor layer, wherein electrical resistance of the first electrode in a farthest distance is equal to or smaller than 1Ω; and a second electrode which is reflective with respect to the wavelength and formed on the second surface, wherein electrical resistance of the second electrode in a farthest distance is equal to or smaller than 1Ω. At least one of the first and the second electrodes is die bonded to a current supply body which supplies the light emitting element with current.

The electrical resistance of the first electrode in the farthest distance means the electrical resistance of the first electrode in the in-plane direction where the length of the electrode is the greatest. Similarly, the electrical resistance of the second electrode in the farthest distance means the electrical resistance of the second electrode in the in-plane direction where the length of the electrode is the greatest. For example, in a case where the plane shape of the light emitting element is rectangular and the p electrode or n electrode is formed on the almost entire surface, the electrical resistance in farthest distance is that in the diagonal direction of the rectangle. Especially, when the rectangle plane shape has the long side which is sufficiently longer than the short side, the electrical resistance in farthest distance is substantially coincident with the resistance in the long side direction of the rectangle. Also, the electrical resistance in the farthest distance is not necessarily the resistance of the first electrode or second electrode simple; but if the first electrode or second electrode is connected with the current supply body via a solder layer, the electrical resistance in the farthest distance in a state where the first electrode or second electrode is integrated with the solder layer, or a state where the first electrode or second electrode is integrated with the current supply body, may be also included in the resistance in the farthest distance of the first electrode and the second electrode as referred to in this invention.

Also, it is supposed that a tapered surface is included on the second surface of the substrate having the second electrode, when the second surface of the substrate is worked in the taper shape. Also, the first electrode and the second electrode signify that when the first electrode indicates the p electrode, the second electrode indicates the n electrode, or if the first electrode indicates the n electrode, the second electrode indicates the p electrode.

The semiconductor materials may be those used for the light emitting element: for example, group III-V semiconductor or group II-VI semiconductor. The materials for the light emitting element from ultraviolet to green light are typically group III nitride semiconductors in which the group V element is nitride among the group III-V semiconductors. The group III nitride semiconductor is GaN, AlGaN, InGaN or AnGaInN, which is represented by the general formula $Al_x$, $Ga_y$ or $In_{1-x-y}N$ ($0 \leq x \leq 1$, $0 \leq y \leq 1$, $0 \leq x+y \leq 1$). The n-type impurity may be Si, and the p-type impurity may be Mg.

The light emitting element of the first aspect of the invention operates with the lateral surface as a light extraction surface. Accordingly, it is desirable that the reflectance in the direction perpendicular to the substrate plane is high. To increase the reflectance, the first electrode and the second electrode should be formed of a highly reflective metal. The highly reflective metal may be Al, Ag, Au or alloy containing these metals as the main component, for example. In addition, the reflectance in the direction perpendicular to the substrate plane may be increased by forming the DBR structure with a multilayer film of $SiO_2$ and $TiO_2$. Also, to diffuse the current in the direction parallel to the substrate surface efficiently, it is desirable that the area of the first electrode and the second electrode is made as wide as possible, and it is desirable that the first electrode covers 50% or more of the surface of the semiconductor layer, and the second electrode covers 50% or more of the second surface of the substrate.

Also, it is desirable that the electrical resistance in the farthest distance of each of the p electrode and the n electrode is equal because the un-uniformity in the current density distribution in the direction parallel to the substrate surface tends to be uniform.

For the substrate that is conductive and transparent to the emission wavelength, if the group III nitride semiconductor is used as the semiconductor material, the group III nitride semiconductor substrate such as GaN substrate or the SiC substrate may be used. Also, if the AlGaInP material is used as the semiconductor material, the GaP substrate may be used, and if the AlGaInAs material is used, the GaAs substrate may be used.

The die bonding may be made by connecting the electrode to the current supply body via the solder or bump, or mechanically connecting it under pressure to the current supply body.

A second aspect of the present invention is the light emitting element according to the first aspect that the electrical resistance of the first electrode in the farthest distance is equal to or smaller than $0.1\Omega$ and the electrical resistance the second electrode in farthest distance is equal to or smaller than $0.1\Omega$.

A third aspect of the present invention is the light emitting element according to the first to second aspect that the electrical resistance of the first electrode in the farthest distance is equal to or smaller than $0.01\Omega$ and the electrical resistance the second electrode in farthest distance is equal to or smaller than $0.01\Omega$.

A fourth aspect of the invention is the light emitting element according to any one of the first to third aspect that the first electrode and the second electrode are made of highly reflective metal which has more than 80% reflectivity to the wavelength of emitted light.

A fifth aspect of the invention is the light emitting element according to any one of the first to fourth aspect that the first electrode covers more than 50% the surface of the semiconductor layer and the second electrode covers more than 50% of the second surface of the substrate.

A sixth aspect of the invention is the light emitting element according to any one of the first to fifth aspect that the semiconductor layer is made of a group III nitride semiconductor.

A seventh aspect of the invention is the light emitting element according to any one of the first to sixth aspect that the substrate is a group III nitride semiconductor substrate.

The group III nitride semiconductor substrate may be the c-plane substrate, or the substrate with the nonpolar plane such as m-plane or a-plane as the principal plane. Also, it may be the n-type or p-type substrate doped with the impurity.

An eighth aspect of the invention is the light emitting element according to the seventh aspect that the substrate is a GaN substrate.

A ninth aspect of the invention is the light emitting element according to any one of the first to eighth aspect that an area of the light emitting element is equal to or larger than 0.25 $mm^2$.

A tenth aspect of the invention is the light emitting element according to any one of the first to ninth aspect that the light emitting element has a rectangular shape in plane.

An eleventh aspect of the invention is the light emitting element according to the tenth aspect that a length of a long side of the rectangular shape is equal to or longer than 500 μm.

A twelfth aspect of the invention is the light emitting element according to any one of the first to eleventh aspect that the second surface of the substrate has the shape having a tapered surface which is inclined relative to the substrate.

It is desirable that the angle of the tapered surface is in the range from 20 to 70 degrees. In this range, the light extraction efficiency is improved.

The shape which has such a tapered surface can be formed by mechanical working, dry etching, or wet etching.

A thirteenth aspect of the invention is the light emitting element according to the twelfth aspect that the tapered surface is inclined from an edge of the second surface to a side surface of the substrate and the second electrode is formed on the tapered surface.

A fourteenth invention is the light emitting element according to the twelfth invention characterized in that a concave portion with the lateral surface as the tapered surface is provided in the central part of the back surface of the substrate.

A fifteenth aspect of the invention is the light emitting element according to any one of the first to fourteenth aspect that one of the first electrode and the second electrode is bonded by a plurality of wires.

A sixteenth aspect of the invention is a light emitting device including the light emitting element according to the thirteenth aspect and a mount including a recess portion which having a side surface. The first electrode and the second electrode contact with the side surface.

A seventeenth aspect of the invention is a light emitting device comprising the light emitting element according to the fourteenth aspect and a mount including a recess portion. The recess portion includes a bottom wall and a cross-section of the recess portion increases in direction perpendicular to the bottom wall.

The first aspect of the invention is the light emitting element for extracting the light from the lateral surface due to reflection of the first electrode and the second electrode. In this first aspect, since the electrical resistance of the light emitting element in the farthest distance of each of the first electrode and the second electrode is equal to or smaller than $1\Omega$, it is possible to improve un-uniformity in the current density distribution in the direction parallel to the substrate surface, whereby the current can be ideally diffused. As a result, the current concentration is suppressed, and the occurrence of a failure such as migration decreases, whereby it is possible to improve the reliability of the device. Also, since the electrical resistance in the farthest distance of each of the p electrode and the n electrode is equal to or smaller than $1\Omega$, a voltage drop occurring due to current diffusion can be suppressed, whereby the drive voltage can be reduced.

Also, as in the second aspect of the invention, when the electrical resistance of the light emitting element in the farthest distance of each of the first electrode and the second electrode is equal to or smaller than 0.1Ω, it is possible to improve un-uniformity in the current density distribution in the direction parallel to the substrate surface, whereby the reliability of the device can be further improved, and the drive voltage can be further reduced. Particularly, as in the third aspect of the invention, when the electrical resistance of the light emitting element in the farthest distance of each of the first electrode and the second electrode is equal to or smaller than 0.01Ω, it is possible to further reduce a bias in the current density distribution in the direction parallel to the substrate surface.

Also, as in the fourth aspect of the invention, since the p electrode and the n electrode are made of highly reflective metal, the light extraction efficiency from the lateral surface can be further improved.

Also, as in the fifth aspect of the invention, since the first electrode and the second electrode are formed to be wider in the plane direction, it is possible to improve un-uniformity in the current density distribution in the direction parallel to the substrate surface.

Also, as in the sixth aspect of the invention, the present invention is applicable to the light emitting element in which the semiconductor layer is made of the group III nitride semiconductor.

Also, as in the seventh aspect of the invention, the group III nitride semiconductor substrate may be used as the substrate, and particularly, as in the eighth aspect, the GaN substrate may be used.

Also, when the ninth aspect of the invention is adopt for the large light emitting element having an area equal to or larger than 0.25 mm$^2$, it provides a preferable effect that makes the current density distribution highly uniform.

Also, as in the tenth aspect of the invention, the present invention is applicable to the light emitting element in which the plane shape is rectangular, Particularly, as in the eleventh aspect, when the invention is adopted for the large light emitting element of the rectangular shape which has a long side of a length equal to or longer than 500μ, it provides a preferable effect that makes that the current density distribution highly uniform.

Also, as in the twelfth to fourteenth aspects of the invention, the second surface of the substrate is tapered, whereby the light extraction efficiency is further improved. This is because it is required to extract the light from the lateral surface in the structure in which the electrodes are provided up and down, and with the taper shape, the light can be reflected in the direction toward the lateral surface, whereby the light extraction efficiency is improved.

Also, as in the fifteenth aspect, one of the p electrode and the n electrode is wire bonded, or bonded by a plurality of wires, whereby the current can be diffused in the plane direction efficiently.

Also, as in the sixteenth aspect, the light emitting element can be mounted on the mount so that the lateral surface on the opposite side of the tapered surface for the light emitting element according to the thirteenth aspect may be on the upper side, whereby the light can be radiated upwards efficiently.

Also, as in the seventeenth invention, the light radiated from the lateral surface of the light emitting element according to the fourteenth invention can be reflected against the lateral surface of the concave portion in the mount and radiated upwards.

DETAIL DESCRIPTION OF THE EXEMPLARY EMBODIMENTS OF THE PRESENT INVENTION

The specific embodiments of the present invention will be described below with reference to the drawings, but the invention is not limited to those embodiments.

Exemplary Embodiment 1

Figure 1A:
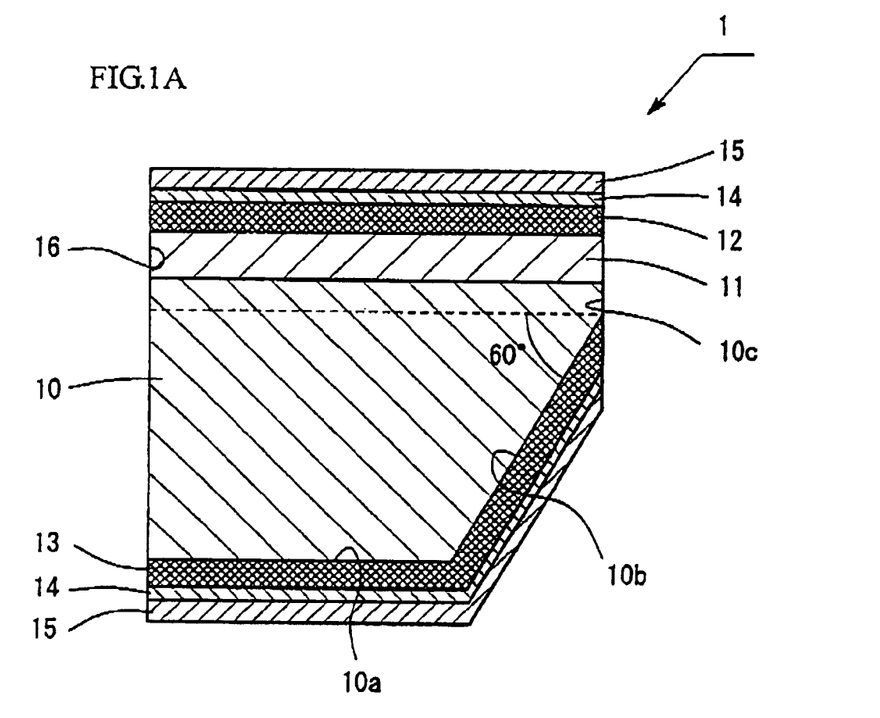
FIG. 1 is a view showing the structure of a light emitting element 1 of an exemplary embodiment 1.

FIG. 1 is a view showing the structure of a light emitting element 1 of an exemplary embodiment 1. The light emitting element 1 includes an n-GaN substrate 10, a semiconductor layer 11 made of group III nitride semiconductor stacked on the surface of the n-GaN substrate 10, a p electrode 12 formed on the entire surface 11*a* of the semiconductor layer 11, and an n electrode 13 formed on a back surface (second surface) 10*a* of the n-GaN substrate 10. Also, the plane shape of the light emitting element 1 is rectangular, in which the long side is 1000 μm, the short side is 300 μm, and the area is 0.3 mm$^2$. FIG. 1A shows the cross-section in the short side direction, in which the long side direction is the direction perpendicular to the paper surface in FIG. 1A.

Figure 1B:
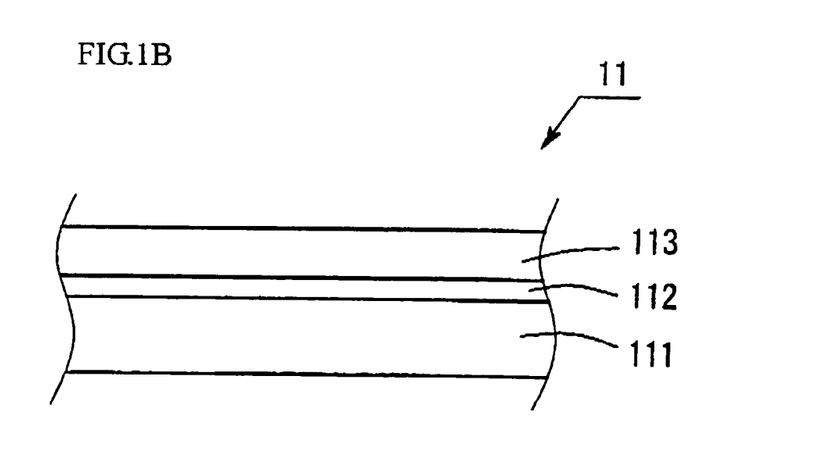

The semiconductor layer 11 has a structure in which an n layer 111, an active layer 112 and a p layer 113 are stacked in this order, as shown in FIG. 1B. The n layer 111 has a structure in which an n-type contact layer made of GaN, doped with Si at high density, and an n clad layer made of GaN are stacked in order, and the p layer 113 has a structure in which a p clad layer made of AlGaN doped with Mg and a p contact layer made of GaN doped with Mg are stacked in order. The active layer 112 has an MQW structure in which a barrier layer made of GaN and a well layer made of InGaN are repeatedly stacked.

The back surface 10*a* of the n-GaN substrate 10 is processed in the taper shape, which is inclined in the direction to one lateral surface 10*c* in the short side direction of the n-GaN substrate 10, and has a tapered surface 10*b* along the long side direction. An inclination angle of the tapered surface 10*b* is about 60 degrees to the n-GaN substrate 10. The n electrode 13 is also formed on this tapered surface 10*b*.

Such taper shape can be easily formed by a solution capable of anisotropically etching the group III nitride semiconductor. As such solution, the phosphoric acids such as phosphoric acid and pyrophosphoric acid, a mixed acid of phosphoric acid and sulfuric acid, potassium hydroxide, and sodium hydroxide may be used. For example, when the back surface 10*a* of the n-GaN substrate 10 is wet etched using phosphoric acid, the tapered surface 10*b* having an inclination of about 60 degrees to the n-GaN substrate 10 is exposed.

Besides, the shape having the tapered surface 10*b* may be formed by dry etching or mechanical working.

The p electrode 12 and the n electrode 13 are made of Ag having a film thickness of 300 nm. In addition to Ag, a highly reflective metal such as Al or Ag alloy may be used. Also, the p electrode 12 and the n electrode 13 are covered with a barrier layer 14 made of Ti/Pt/Au and a junction electrode layer 15 of solder made of Au. The total thickness of the barrier layer 14 and the junction electrode layer 15 in combination is about 1 μm. The resistance of each of the p electrode 12 and the n electrode 13 in the long side direction (almost equal to the resistance in the farthest distance in the invention) in a state where the barrier layer 14 and the junction electrode layer 15 are combined is 0.1Ω.

This light emitting element 1 operates by reflecting light emitted from the MQW layer 112 of light emitting layer against the p electrode 12 and the n electrode 13 with a lateral surface 16 on the opposite side of the tapered surface 10b formed as a main light extraction surface.

Herein, since the resistance of each of the p electrode 12 and the n electrode 13 in the long side direction is equal to or smaller than 1Ω, the current can be ideally diffused in the direction parallel to the substrate surface, whereby it is possible to reduce a bias in the current density distribution in the direction parallel to the substrate surface. Therefore, the current concentration can be suppressed, and the occurrence of a failure such as electro migration can be prevented, whereby the reliability of the device is improved. It is desirable that the electrical resistance of each of the p electrode 12 and the n electrode 13 in the long side direction of the light emitting element 1 is equal to or smaller than 0.1Ω, because it is possible to further improve un-uniformity in the current density distribution in the direction parallel to the substrate surface, and it is more desirable that the electrical resistance is equal to or smaller than 0.01Ω.

Also, since the electrical resistance of each of the p electrode 12 and the n electrode 13 in the long side direction of the light emitting element 1 is equal to or smaller than 1Ω, a voltage drop caused by current diffusion can be suppressed, whereby the drive voltage during the large current driving can be lower than related arts. Also, since the back surface of the n-GaN substrate 10 is processed in the taper shape having the tapered surface 10b and the n electrode 13 is formed on the tapered surface 10b, the quantity of light reflected in the direction to the lateral surface 16 by the tapered surface 10b increases, whereby the light extraction efficiency is improved.

Though the angle of the tapered surface 10b is 60 degrees in this exemplary embodiment 1, the angle of the tapered surface 10b to the n-GaN substrate 10 may be in the range from 20 to 70 degrees. In this range, the light extraction efficiency can be further improved.

FIGS. 2 to 5 show the results of the simulation for the current density distribution and the driving voltage in the long side direction when the drive current is 1 A and the electrical resistance of each of the p electrode and the n electrode in the long side direction is variously changed. To facilitate the analysis, the light emitting element having a structure in which the back surface of the n-GaN substrate 10 in the light emitting element 1 is not processed in the taper shape was used as a model.

Figure 2:
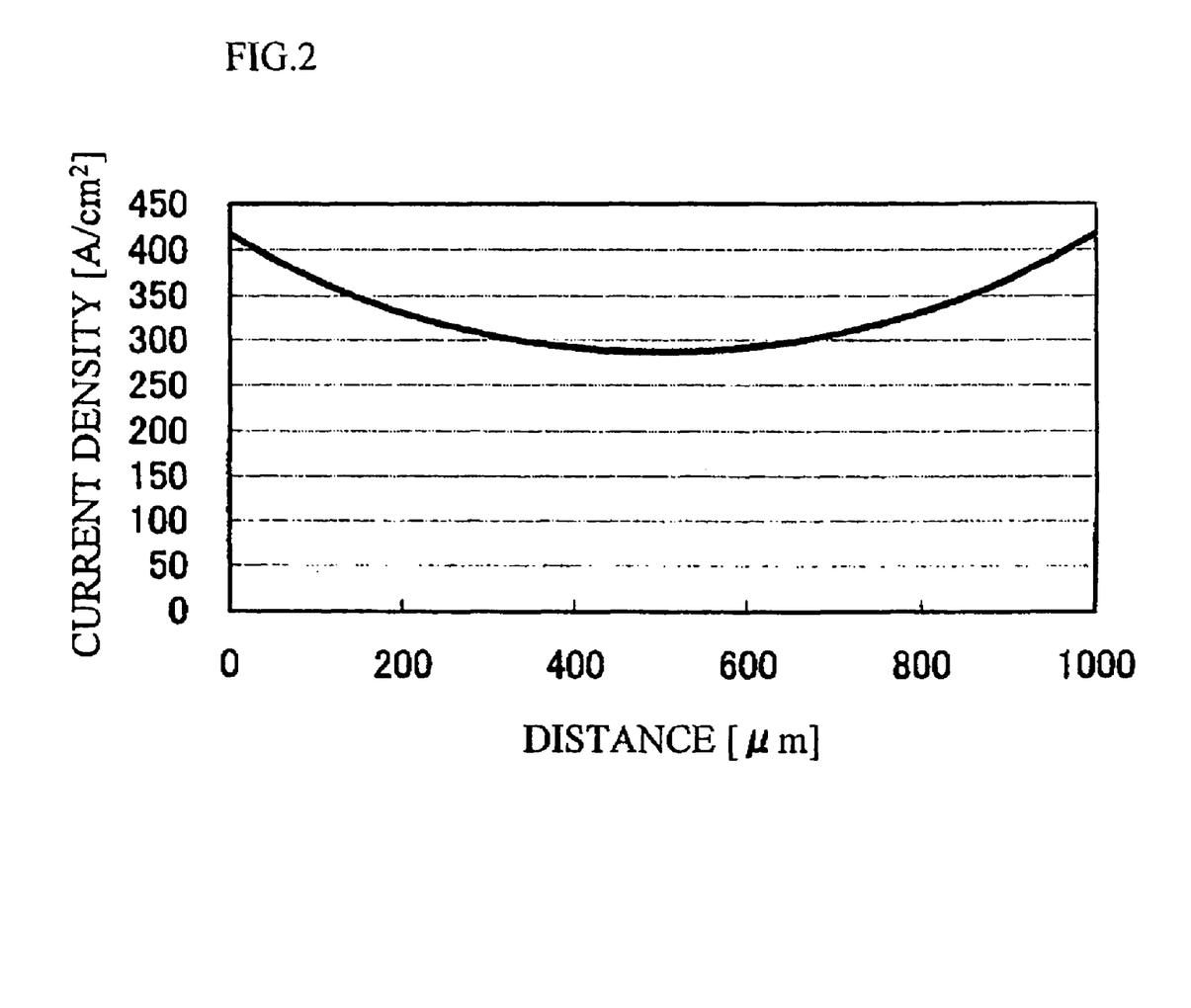
FIG. 2 is a graph showing the simulation result of a current density distribution.

FIG. 2 shows the current density distribution in the long side direction when the electrical resistance of each of the p electrode and the n electrode in the long side direction is 0.7Ω. From FIG. 2, it can be found that the current density distribution in the long side direction is relatively uniform. Also, the drive voltage was 3.7V. This is in the range not too larger than that for the small light emitting element of a group III nitride semiconductor.

Figure 3:
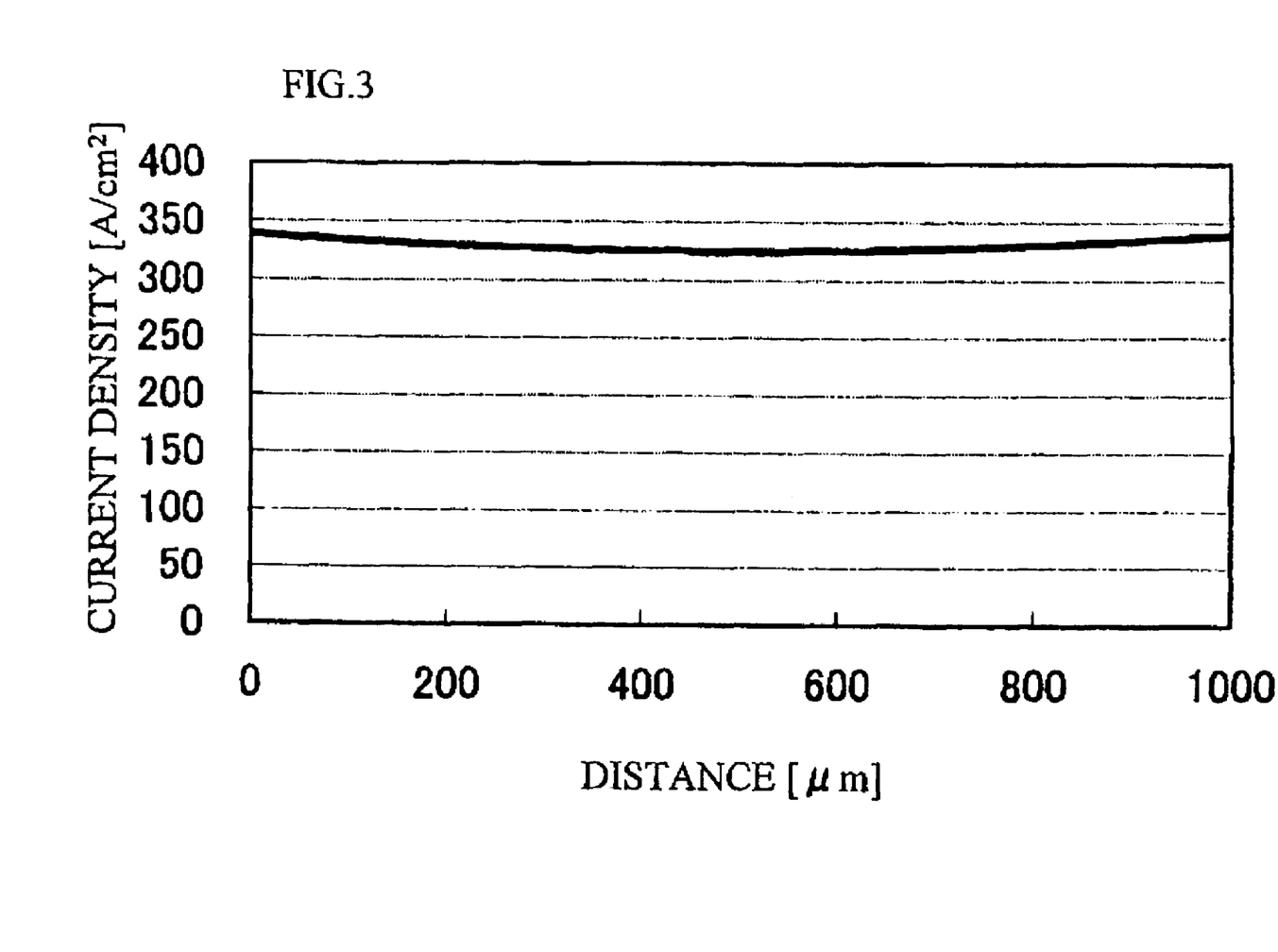
FIG. 3 is a graph showing the simulation result of the current density distribution.

FIG. 3 shows the current density distribution in the long side direction when the electrical resistance of each of the p electrode and the n electrode in the long side direction is 0.07Ω. From FIG. 3, it can be found that the current density distribution in the long side direction is more uniform than in FIG. 2. Also, the drive voltage was 3.3V, and lower than in FIG. 2.

Figure 4:
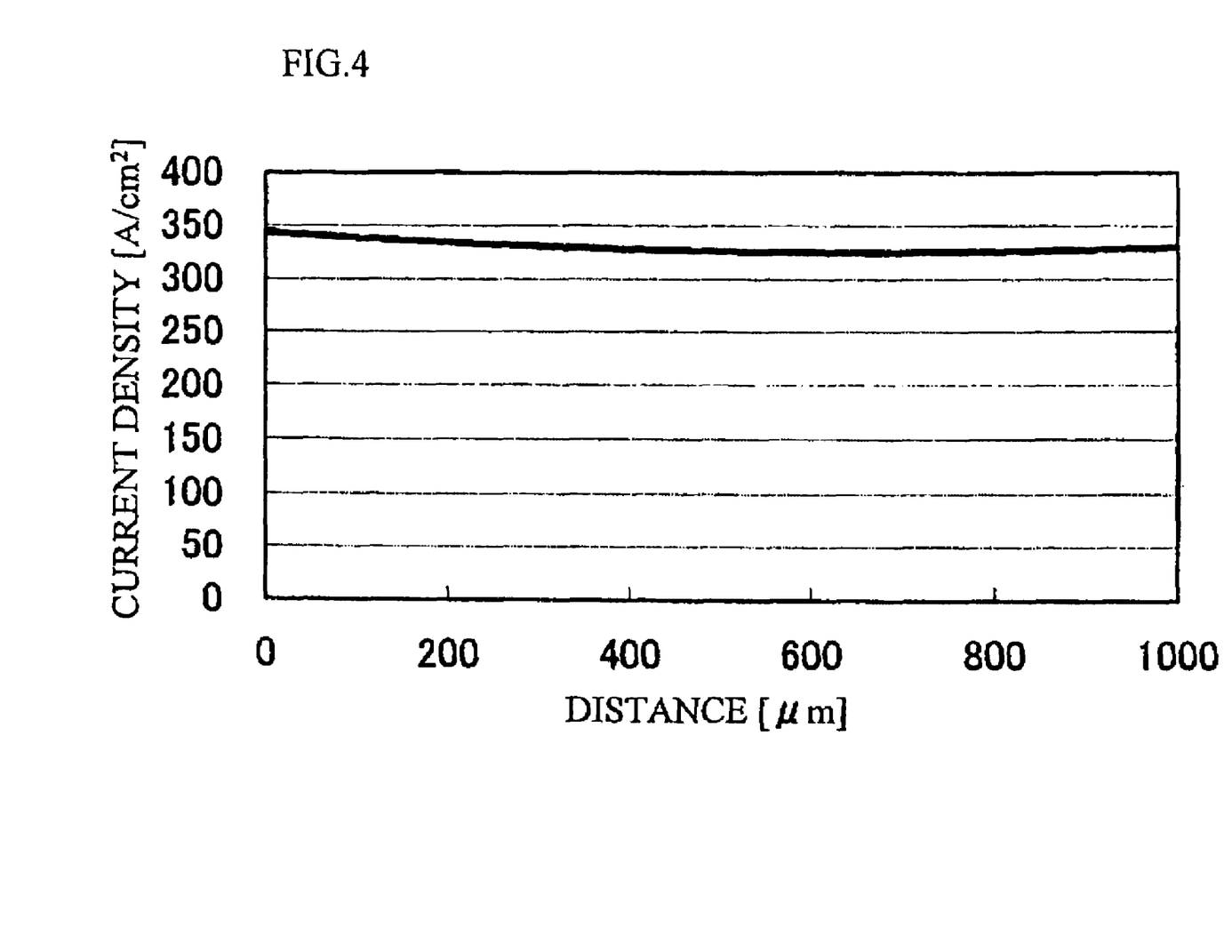
FIG. 4 is a graph showing the simulation result of a current density distribution.

FIG. 4 shows the current density distribution in the long side direction when the electrical resistance of the p electrode in the long side direction is 0.07Ω and the electrical resistance of the n electrode in the long side direction is 0.03Ω. Since the electrical resistance of each of the p electrode and the n electrode in the long side direction is small enough as shown in FIG. 3, there is less influence of the electrical resistance on the current density distribution even if the electrical resistance of the p electrode in the long side direction and the electrical resistance of the n electrode in the long side direction are different, whereby the uniform distribution equivalent to the case of FIG. 3 is obtained. Also, the drive voltage was 3.3V as in the case of FIG. 3.

Figure 5:
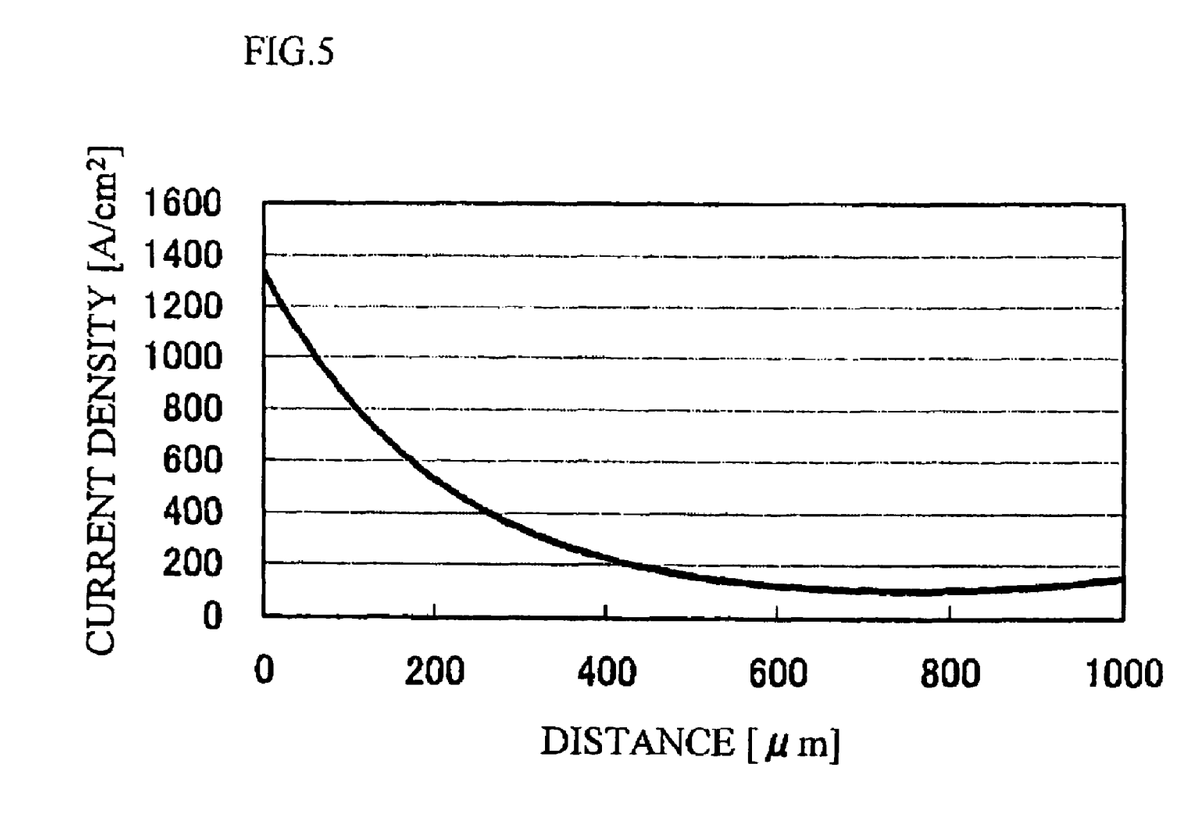
FIG. 5 is a graph showing the simulation result of the current density distribution.

FIG. 5 shows the current density distribution in the long side direction when the electrical resistance of the p electrode in the long side direction is 6.7Ω and the electrical resistance of the n electrode in the long side direction is 0.67Ω. Even though the electrical resistance of one electrode in the long side direction is small, the electrical resistance of the other electrode in the long side direction is high as shown in FIG. 5, whereby there is some bias in the current density distribution. Also, the drive voltage was 4.8V, which was not low enough.

Figure 6:
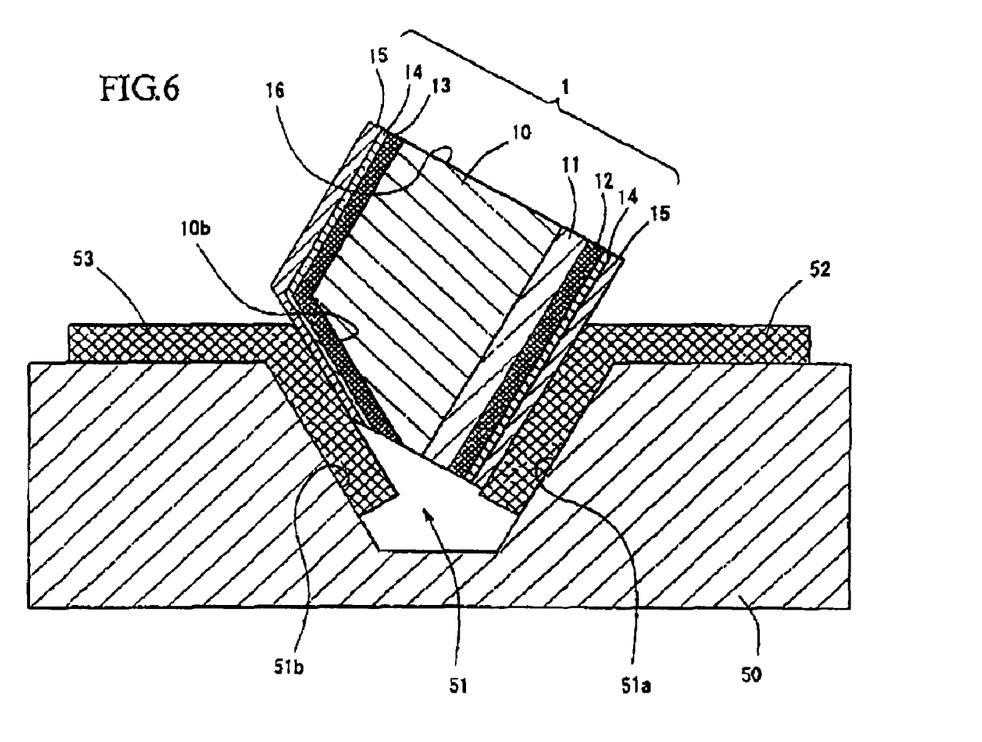
FIG. 6 is a view showing the structure of a light emitting device mounting the light emitting element 1.

FIG. 6 shows a structure of a light emitting device in which the light emitting element 1 is mounted on a sub-mount 50. The sub-mount 50 is made of Si and has a concave portion 51 like a prismoid of which the cross-sectional area increases from the bottom surface to the upper surface (in a direction perpendicular to the bottom surface). This concave portion 51 was formed by wet etching with a solution capable of anisotropic etching of Si. A p electrode 52 is formed from one lateral surface 51a of the concave portion 51 to the surface of the sub-mount 50 and an n electrode 53 is formed from a lateral surface 51b of the concave portion 51 opposite to the lateral surface 51a to the surface of the sub-mount 50. The light emitting element 1 is fitted into the concave portion 51 and mounted so that the p electrode 12 of the light emitting element 1 and the p electrode 52 of the sub-mount 50 formed on the lateral surface 51a may be in contact, and the n electrode 13 of the light emitting element 1 and the n electrode of the sub-mount 50 formed on the lateral surface 51b may be in contact. That is, both the p electrode 12 and the n electrode 13 of the light emitting element 1 are die bonded to the sub-mount 50 that is a current supply body.

By mounting the light emitting element 1 in this way, it is possible to emit light upwards from the lateral surface 16 on the opposite side of the tapered surface 10b efficiently.

Exemplary Embodiment 2

Figure 7:
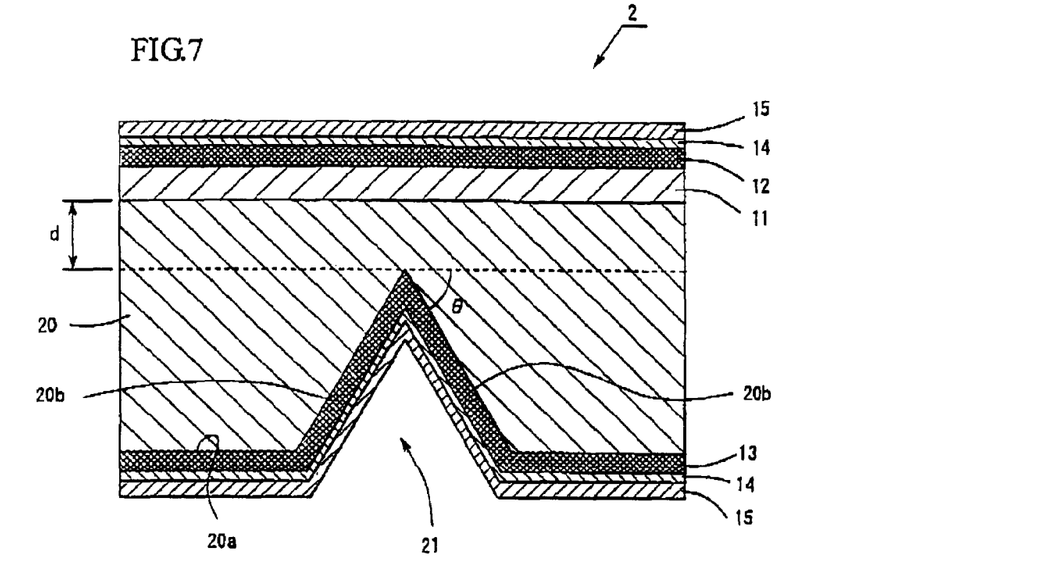
FIG. 7 is a view showing the structure of a light emitting element 2 of an exemplary embodiment 2.

FIG. 7 shows a structure of a light emitting element 2 of an embodiment 2. This light emitting element 2 includes the semiconductor layer 11, the p electrode 12 and the n electrode 13 on the surface of an n-GaN substrate 20 in the same way as the light emitting element 1 of the embodiment 1. A difference from the light emitting element 1 of the embodiment 1 is that the worked shape of a back surface 20a of the n-GaN substrate 20 is different from the worked shape of the n-GaN substrate 10 in the embodiment 1. That is, it is different in that a concave portion 21 in the shape of V character with a tapered surface 20b inclined to the n-GaN substrate 20 as the lateral surface is formed in the central part of the back surface 20a of the n-GaN substrate 20. It is desirable that the thickness d from the position of a vertex angle of the V character to the semiconductor layer is in the range from 30 to 60% of the thickness of the n-GaN substrate 20. Also, it is desirable that the angle θ of the tapered surface 20b to the n-GaN substrate 20 is in the range from 20 to 70 degrees. If the thickness d and the angle θ are in the above ranges, the light extraction efficiency can be further improved.

This light emitting element 2, like the light emitting element 1 of the embodiment 1, has the high device reliability, because the current concentration is suppressed, in which the drive voltage is reduced. Further, since light can be reflected in the lateral surface direction by the n electrode 13 formed on the tapered surface 20b, the light extraction efficiency in the lateral surface direction is improved.

Figure 8:
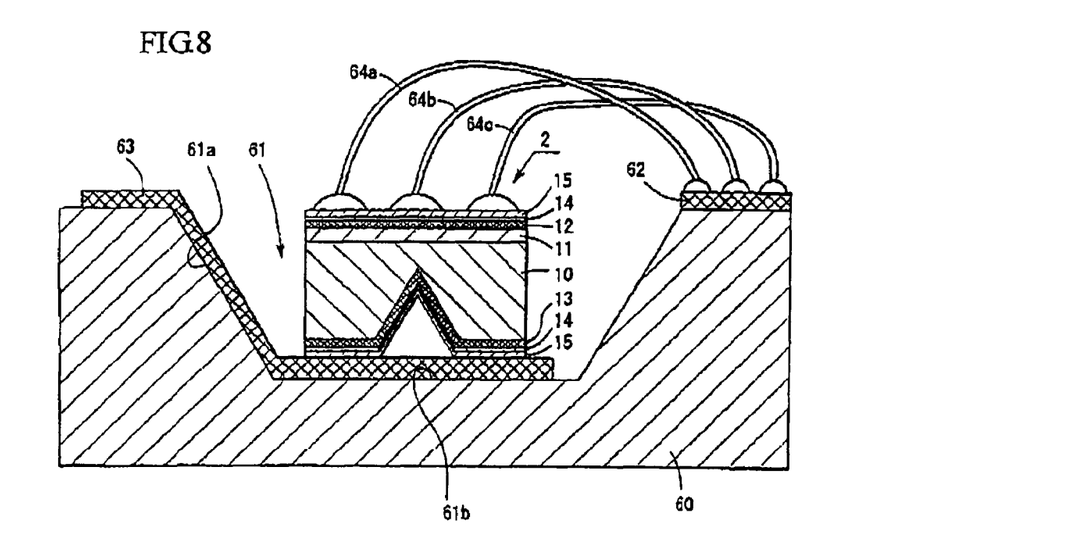
FIG. 8 is a view showing the structure of the light emitting device mounting the light emitting element 2.

FIG. 8 is a view showing the structure of a light emitting device in which the light emitting element 2 is mounted on a sub-mount 60. The sub-mount 60 is formed with a concave portion 61 like a prismoid of which the cross-sectional area increases from the bottom surface to the upper surface, in which a bottom surface 61b of the concave portion 61 has a wider area than the light emitting element 2. An n electrode 63 is formed from a bottom surface 61b of the concave portion 61 to a lateral surface 61a of the sub-mount 60 and the upper surface of the sub-mount 60, and a p electrode 62 is formed at the position separated away from the n electrode 63 on the upper surface of the sub-mount 60. The light emitting element 2 is mounted so that the n electrode 13 of the light emitting element 2 is die bonded to the n electrode 62 formed on the bottom surface 61b of the concave portion 61 to connect to then electrode 63, in which the p electrode 12 of the light emitting element 2 and the p electrode 62 of the sub-mount 60 are connected by the bonding wires 64a, 64b and 64c.

By mounting the light emitting element 2 in this way, it is possible to emit light upwards efficiently by reflecting light emitted from the lateral surface of the light emitting element 2 against the lateral surface 61a of the sub-mount 60. Also, since the p electrode 12 is bonded by a plurality of wires, the current can be diffused in the plane direction efficiently.

Though the back surface of the substrate is made in the taper shape in this embodiment, the back surface may not be necessarily worked in the taper shape. However, it is desirable to improve the light extraction efficiency from the lateral surface by working the back surface in the taper shape.

Also, though the p electrode and the n electrode are made of highly reflective metal to increase the reflectance and improve the light extraction efficiency in the embodiment, a DBR structure composed of a multilayer film of $SiO_2$ and $TiO_2$ may be formed on the upper side and the lower side of a light emitting layer to increase the reflectance.

Also, though the n-GaN substrate is used as a growth substrate in the embodiment, the invention is not limited to this, but it is necessary that the substrate is conductive and transparent to the emission wavelength. For example, the group III nitride semiconductor substrate such as AlGaN or the SiC substrate may be used. Also, it is not necessary that the semiconductor layer is made of the group III nitride semiconductor, but may be AlGaInAs material or AlGaInP material, for example, as conventionally used as the materials of the light emitting element. In the case where the AlGaInAs material is used, the GaAs substrate may be used as the growth substrate, or in the case where the AlGaInP material is used, the GaP substrate may be used as the growth substrate.

Also, though the plane shape of the light emitting element is rectangular in the embodiment, any shape may be used. Also, though the dimension of the light emitting element is not limited to the embodiment, it is desirable that the long side is 500 μm or more, if the area of the light emitting element is 0.25 $mm^2$ or more, or the plane shape of the light emitting element is rectangular. In such large light emitting element, since the uniformity of the current density distribution is low, the invention may be applied to increase the uniformity of the current density distribution effectively.

INDUSTRIAL APPLICABILITY

The light emitting element of the invention is suitable for the large current uses, and can be used for the general illumination.

The invention claimed is:

1. A light emitting element which emits light of a wavelength, the light, emitting element comprising:
    a substrate which is transparent to the wavelength of emitted light and includes a first surface and a second surface;
    a semiconductor layer stacked on the first surface;
    a first electrode which is reflective to the wavelength of emitted light and formed on a surface of the semiconductor layer; and
    a second electrode which is reflective to the wavelength of emitted light and formed on the second surface,
    wherein an electrical resistance of the first electrode in, a farthest distance is equal to or smaller than 1Ω,
    wherein an electrical resistance of the second electrode in a farthest distance is equal to or smaller than 1Ω, and
    wherein at least one of the first and the second electrodes is die bonded to a current supply body which supplies the light emitting element with current.

2. The light emitting element according to claim 1, wherein the electrical resistance of the first electrode in the farthest distance is equal to or smaller than 0.1Ω and the electrical resistance of the second electrode in the farthest distance is equal to or smaller than 0.1Ω.

3. The light emitting element according to claim 1, wherein the electrical resistance of the first electrode in the farthest distance is equal to or smaller than 0.01Ω and the electrical resistance of the second electrode in the farthest distance is equal to or smaller than 0.01Ω.

4. The light emitting element according to claim 1, wherein the first electrode and the second electrode include a metal which has more than 80% reflectivity to the wavelength of emitted light.

5. The light emitting element according to claim 1, wherein the first electrode covers more than 50% of the first surface of the semiconductor layer, and the second electrode covers more than 50% of the second surface.

6. The light emitting element according to claim 1, wherein the semiconductor layer comprises a group III nitride semiconductor.

7. The light emitting element according to claim 2, wherein the substrate comprises a group III nitride semiconductor.

8. The light emitting element according to claim 7, wherein the substrate comprises a Gallium Nitride substrate.

9. The light emitting element according to claim 1, wherein an area of the light emitting element is equal to or larger than 0.25 $mm^2$.

10. The light emitting element according to claim 1, wherein the light emitting element has a rectangular shape in-plane.

11. The light emitting element according to claim 10, wherein a length of a long side of the rectangular shape is equal to or longer than 500 μm.

12. The light emitting element according to claim 1, wherein the second surface includes a tapered surface, which is inclined relative to the substrate.

13. The light emitting element according to claim 12, wherein the tapered surface is inclined from an edge of the second surface to a side surface of the substrate and the second electrode is formed on the tapered surface.

14. The light emitting element according to claim 12, wherein a concave portion is formed at a center of the second surface so as to have the tapered surface as a side surface of the concave portion.

15. The light emitting element according to claim 1, wherein one of the first electrode and the second electrode is bonded by a plurality of wires.

16. A light emitting device comprising:
the light emitting element according to claim 13; and
a sub-mount including a concave portion having a side surface,
wherein the first electrode and the second electrode contact the side surface.

17. A light emitting device comprising:
the light emitting element according to claim 14; and
a sub-mount including a concave portion,
wherein the concave portion of the sub-mount includes a bottom surface and a cross-section of the concave portion of the sub-mount increases in a direction perpendicular to the bottom surface.

18. The light emitting element according to claim 1, wherein the dye bonding is made via a solder, bump, or by mechanically connecting the first electrode or the second electrode under pressure to the current supply body.

19. The light emitting element according to claim 12, wherein the tapered surface is tapered at an angle of 20 degrees to 70 degrees.

20. The light emitting element according to claim 1, wherein the light emitting element has a lateral surface, which operates as a light extraction surface.

21. The light emitting element according to claim 1, wherein the resistance of the first electrode is substantially equal to the resistance of the second electrode.

22. The light emitting element according to claim 1, wherein both the first electrode and the second electrode are die bonded to the current supply body.

23. The light emitting element according to claim 14, wherein the concave portion substantially matches the tapered surface so that the second electrode substantially contacts the side surface of the concave portion.

24. The light emitting element according to claim 1, wherein a current density is substantially uniformly distributed in a direction parallel to the first surface and the second surface of the substrate.

* * * * *